(12) United States Patent
Nagatomo et al.

(10) Patent No.: US 12,726,169 B2
(45) Date of Patent: Sep. 1, 2026

(54) ACOUSTIC WAVE DEVICE

(71) Applicant: Murata Manufacturing Co., Ltd., Nagaokakyo (JP)

(72) Inventors: Sho Nagatomo, Nagaokakyo (JP); Tetsuya Kimura, Nagaokakyo (JP); Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 971 days.

(21) Appl. No.: 17/705,307

(22) Filed: Mar. 26, 2022

(65) Prior Publication Data

US 2022/0216843 A1 Jul. 7, 2022

Related U.S. Application Data

(63) Continuation-in-part of application No. PCT/JP2020/036415, filed on Sep. 25, 2020.

(30) Foreign Application Priority Data

Sep. 27, 2019 (JP) ................................ 2019-177325

(51) Int. Cl.

*H03H 9/02* (2006.01)
*H03H 9/13* (2006.01)
*H03H 9/17* (2006.01)

(52) U.S. Cl.

CPC .... *H03H 9/02086* (2013.01); *H03H 9/02031* (2013.01); *H03H 9/02228* (2013.01); *H03H 9/132* (2013.01); *H03H 9/174* (2013.01); *H03H 9/175* (2013.01); *H03H 9/176* (2013.01)

(58) Field of Classification Search

CPC ........... H03H 9/02086; H03H 9/02031; H03H 9/02228; H03H 9/132; H03H 9/174; H03H 9/175; H03H 9/176

See application file for complete search history.

(56) References Cited

U.S. PATENT DOCUMENTS 5,853,601 A 12/1998 Krishaswamy et al.
7,463,118 B2 12/2008 Jacobsen
7,684,109 B2 3/2010 Godshalk et al.
7,868,519 B2 1/2011 Umeda (Continued)

FOREIGN PATENT DOCUMENTS

CN 109891612 A 6/2019
JP 09-298441 A 11/1997

(Continued)

OTHER PUBLICATIONS

Official Communication issued in International Patent Application No. PCT/JP2020/036415, mailed on Dec. 15, 2020.

(Continued)

*Primary Examiner* — Sean Gugger
(74) *Attorney, Agent, or Firm* — Keating & Bennett, LLP

(57) ABSTRACT

An acoustic wave device includes a piezoelectric layer made of lithium niobate or lithium tantalate, and first and second electrodes opposed to each other in a direction that intersects with a thickness direction of the piezoelectric layer. The first and second electrodes are adjacent electrodes, and, when a thickness of the piezoelectric layer is d and a distance between centers of the first and second electrodes is p, d/p is less than or equal to about 0.5.

25 Claims, 16 Drawing Sheets

(56) References Cited

U.S. PATENT DOCUMENTS

| | | | | |
|---|---|---|---|---|
| 8,278,802 | B1 | 10/2012 | Lee et al. | |
| 9,219,466 | B2 | 12/2015 | Meltaus et al. | |
| 9,780,759 | B2 | 10/2017 | Kimura et al. | |
| 10,601,392 | B2 | 3/2020 | Plesski et al. | |
| 10,756,697 | B2 | 8/2020 | Plesski et al. | |
| 11,146,231 | B2 | 10/2021 | Plesski | |
| 2004/0207485 | A1 | 10/2004 | Kawachi et al. | |
| 2007/0188047 | A1 | 8/2007 | Tanaka | |
| 2007/0194863 | A1 | 8/2007 | Shibata et al. | |
| 2008/0169728 | A1* | 7/2008 | Asai | H03H 3/04 29/25.35 |
| 2010/0064492 | A1 | 3/2010 | Tanaka | |
| 2010/0223999 | A1* | 9/2010 | Onoe | H03H 9/02622 73/579 |
| 2013/0057360 | A1* | 3/2013 | Meltaus | H03H 9/205 29/25.35 |
| 2014/0151151 | A1 | 6/2014 | Reinhardt | |
| 2014/0312994 | A1 | 10/2014 | Meltaus et al. | |
| 2016/0182009 | A1 | 6/2016 | Bhattacharjee | |
| 2017/0187352 | A1 | 6/2017 | Omura | |
| 2017/0264263 | A1 | 9/2017 | Huang et al. | |
| 2018/0159494 | A1 | 6/2018 | Goto et al. | |
| 2019/0245510 | A1 | 8/2019 | Mimura | |
| 2019/0386637 | A1 | 12/2019 | Plesski et al. | |
| 2020/0304091 | A1 | 9/2020 | Yantchev | |
| 2021/0273632 | A1 | 9/2021 | Yantchev et al. | |
| 2025/0015779 | A1 | 1/2025 | Yamaji et al. | |

FOREIGN PATENT DOCUMENTS

| | | | |
|---|---|---|---|
| JP | 2004072204 | A | 3/2004 |
| JP | 2007251910 | A | 9/2007 |
| JP | 2010-233210 | A | 10/2010 |
| JP | 2011171886 | A | 9/2011 |
| JP | 2012-257019 | A | 12/2012 |
| JP | 2013-115496 | A | 6/2013 |
| JP | 2013-528996 | A | 7/2013 |
| JP | 2018-074575 | A | 5/2018 |
| JP | 2019-140456 | A | 8/2019 |
| WO | 2020092414 | A2 | 5/2020 |
| WO | 2023190610 | A1 | 10/2023 |

OTHER PUBLICATIONS

International Search Report and Written Opinion for PCT Application No. PCT/US2019/058632, mailed Jan. 17, 2020, 8 pages.

Kadota et al., "Wideband acoustic wave resonators composed of hetero acoustic layer structure", Japanese Journal of Applied Physics 57.07LD12, Jun. 5, 2018, 5 pages.

Ekeom et al., "Solidly Mounted Resonator (SMR) FEM-BEM Simulation", Proceedings of the IEEE Ultrasonics Symposium, Nov. 2006, 4 pages.

Pang et al., "Analytical and experimental study on the second harmonic mode response of a bulk acoustic wave resonator", Journal of Micromechanics and Microengineering vol. 20, Oct. 15, 2010, 11 pages.

* cited by examiner 91
3
3f
3e
2a
4
4f
4e
2
2b 3
2a
4
2
2b 3
2a
4
2
2b 3
2a
4
2
2b

ACOUSTIC WAVE DEVICE

CROSS REFERENCE TO RELATED APPLICATIONS

This application claims the benefit of priority to Japanese Patent Application No. 2019-177325 filed on Sep. 27, 2019 and is a Continuation Application of PCT Application No. PCT/JP2020/036415 filed on Sep. 25, 2020. The entire contents of each application are hereby incorporated herein by reference.

BACKGROUND OF THE INVENTION

1. Field of the Invention

The present invention relates to an acoustic wave device having a piezoelectric layer made of lithium niobate or lithium tantalate.

2. Description of the Related Art

Hitherto, there is known an acoustic wave device that uses plate waves that propagate in a piezoelectric film made of $LiNbO_3$ or $LiTaO_3$. For example, the following Japanese Unexamined Patent Application Publication No. 2012-257019 describes an acoustic wave device that uses Lamb waves as plate waves. In Japanese Unexamined Patent Application Publication No. 2012-257019, an interdigital transducer electrode is provided on the top surface of a piezoelectric film made of $LiNbO_3$ or $LiTaO_3$. A voltage is applied between a plurality of electrode fingers connected to one potential of the interdigital transducer electrode and a plurality of electrode fingers connected to the other potential of the interdigital transducer electrode. Thus, Lamb waves are excited. A reflector is provided on each side of the interdigital transducer electrode. Thus, an acoustic wave resonator that uses plate waves is provided.

SUMMARY OF THE INVENTION

In the acoustic wave device described in Japanese Unexamined Patent Application Publication No. 2012-257019, it is conceivable to reduce the number of electrode fingers for the purpose of reducing the size. However, when the number of electrode fingers is reduced, the quality factor reduces.

Preferred embodiments of the present invention provide acoustic wave devices each capable of increasing a quality factor even when the size is reduced.

An acoustic wave device according to a preferred embodiment of the present invention includes a piezoelectric layer made of lithium niobate or lithium tantalate, and a first electrode and a second electrode opposed to each other in a direction that intersects with a thickness direction of the piezoelectric layer, wherein the acoustic wave device uses bulk waves in a first thickness-shear mode.

An acoustic wave device according to another preferred embodiment of the present invention includes a piezoelectric layer made of lithium niobate or lithium tantalate, and a first electrode and a second electrode opposed to each other in a direction that intersects with a thickness direction of the piezoelectric layer, wherein the first electrode and the second electrode are adjacent electrodes, and, when a thickness of the piezoelectric layer is d and a distance between a center of the first electrode and a center of the second electrode is p, d/p is less than or equal to about 0.5.

In acoustic wave devices according to preferred embodiments of the present invention, it is possible to increase the quality factor even when the size is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that each of the preferred embodiments described in the specification is illustrative and that partial replacements or combinations of components are possible among different preferred embodiments.

A preferred embodiment of the present invention includes a piezoelectric layer made of lithium niobate or lithium tantalate, and a first electrode and a second electrode opposed to each other in a direction that intersects with a thickness direction of the piezoelectric layer.

In the first preferred embodiment, bulk waves in a first thickness-shear mode are used. In addition, in a modification of the first preferred embodiment, the first electrode and the second electrode are adjacent electrodes, and, when a thickness of the piezoelectric layer is d and a distance between a center of the first electrode and a center of the second electrode is p, d/p is less than or equal to about 0.5. With this configuration, in the first preferred embodiment and modification thereof, even when the size is reduced, the quality factor is increased.

Figure 1A:
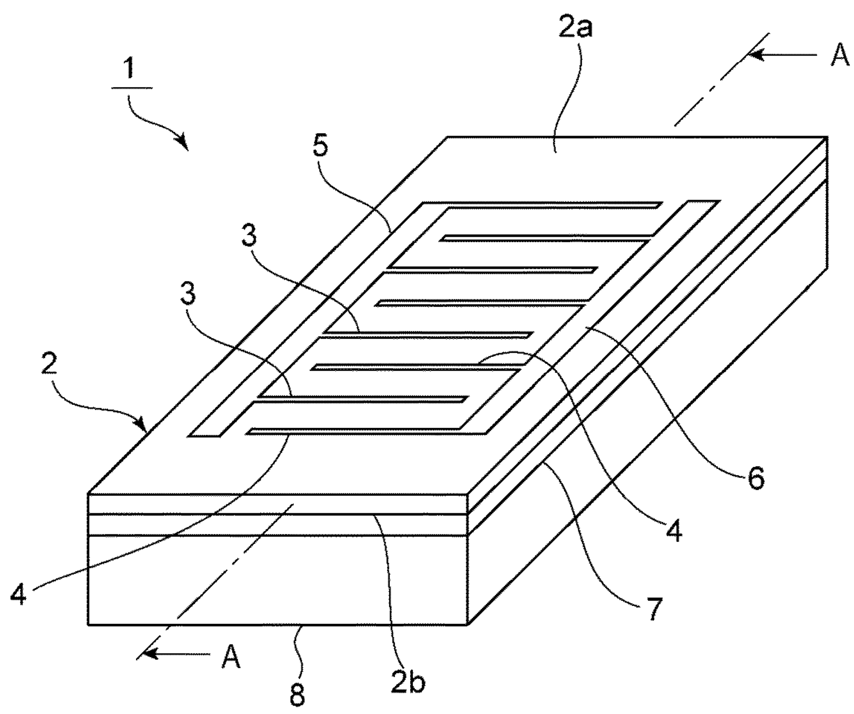
FIG. 1A is a schematic perspective view of the appearance of an acoustic wave device according to a first preferred embodiment of the present invention.
Figure 1B:
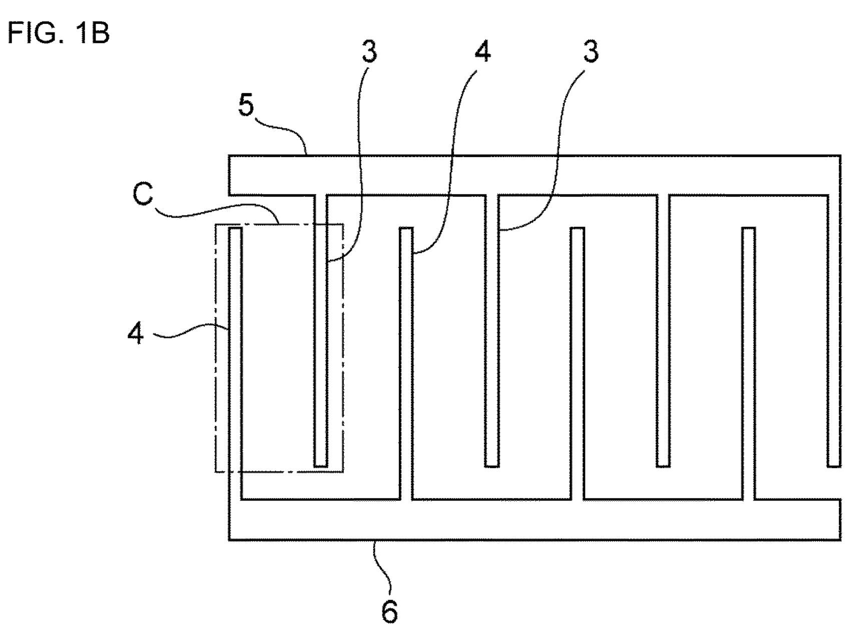
FIG. 1B is a plan view of an electrode structure on a piezoelectric layer.
Figure 2:
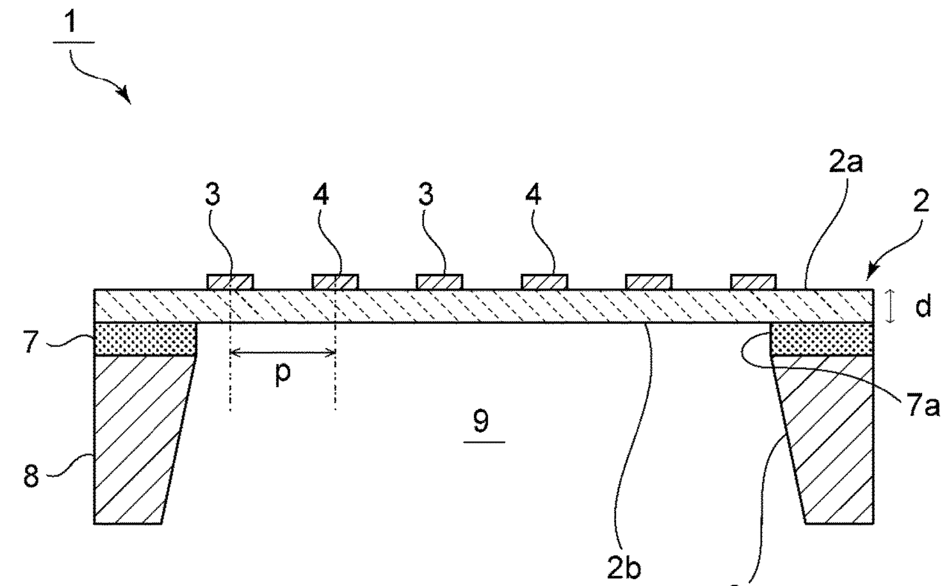
FIG. 2 is a cross-sectional view taken along the line A-A in FIG. 1A.

FIG. 1A is a schematic perspective view of the appearance of an acoustic wave device according to the first preferred embodiment. FIG. 1B is a plan view of an electrode structure on a piezoelectric layer. FIG. 2 is a cross-sectional view taken along the line A-A in FIG. 1A.

The acoustic wave device 1 includes a piezoelectric layer 2 made of $LiNbO_3$. The piezoelectric layer 2 may be made of $LiTaO_3$. The cut angle of $LiNbO_3$ or $LiTaO_3$ is Z-cut in the present preferred embodiment and may be rotated Y-cut or X-cut. Preferably, a propagation direction of about ±30° with respect to Y propagation or X propagation is preferable. The thickness of the piezoelectric layer 2 is not limited and is preferably greater than or equal to about 50 nm and less than or equal to about 600 nm to effectively excite a first thickness-shear mode. The piezoelectric layer 2 includes opposed first and second principal surfaces 2_a_, 2_b_. Electrodes 3 and electrodes 4 are provided on the first principal surface 2_a_. Here, the electrodes 3 are examples of the "first electrode", and the electrodes 4 are examples of the "second electrode". In FIGS. 1A and 1B, the plurality of electrodes 3 is connected to a first busbar 5. The plurality of electrodes 4 is connected to a second busbar 6. The plurality of electrodes 3 and the plurality of electrodes 4 interdigitate with each other. The electrodes 3 and the electrodes 4 each have a rectangular shape and have a length direction. In a direction orthogonal to the length direction, each of the electrodes 3 and an adjacent one of the electrodes 4 are opposed to each other. The length direction of the electrodes 3, 4 and the direction orthogonal to the length direction of the electrodes 3, 4 both are directions that intersect with a thickness direction of the piezoelectric layer 2. For this reason, each of the electrodes 3 and an adjacent one of the electrodes 4 may be regarded as being opposed to each other in the direction that intersects with the thickness direction of the piezoelectric layer 2. Alternatively, the length direction of the electrodes 3, 4 may be interchanged with the direction orthogonal to the length direction of the electrodes 3, 4, shown in FIGS. 1A and 1B. In other words, in FIGS. 1A and 1B, the electrodes 3, 4 may be extended in a direction in which the first busbar 5 and the second busbar 6 extend. In this case, the first busbar 5 and the second busbar 6 extend in the direction in which the electrodes 3, 4 extend in FIGS. 1A and 1B. A plurality of pairs of adjacent electrodes 3, 4 respectively connected to one potential and the other potential is provided in the direction orthogonal to the length direction of the electrodes 3, 4. Here, a state where the electrode 3 and the electrode 4 are adjacent to each other does not mean a case where the electrode 3 and the electrode 4 are disposed so as to be in direct contact with each other and means a case where the electrode 3 and the electrode 4 are disposed with a gap therebetween. When the electrode 3 and the electrode 4 are adjacent to each other, no electrode connected to a hot electrode or a ground electrode, including the other electrodes 3, 4, is disposed between the electrode 3 and the electrode 4. The number of the pairs is not necessarily an integer number of pairs and may be 1.5 pairs, 2.5 pairs, or the like. The distance between the centers of the electrodes 3, 4, that is, pitch, preferably falls within the range of greater than or equal to about 1 μm and less than or equal to about 10 μm. In addition, when at least one of the number of electrodes 3 and the number of electrodes 4 is more than one (when, where the electrodes 3, 4 are assumed as a paired electrode set, 1.5 pairs or more of the electrode sets), the distance between the centers of the electrodes 3, 4 means an average of the distance between any adjacent electrodes 3, 4 of the 1.5 pairs or more of the electrodes 3, 4. The width of each of the electrodes 3, 4, that is, the dimension of each of the electrodes 3, 4 in the opposed direction, preferably falls within the range of greater than or equal to about 50 nm and less than or equal to about 1000 nm.

The distance between the centers of the electrodes 3, 4 is the distance between the center of the dimension (width dimension) of the electrode 3 in the direction orthogonal to the length direction of the electrode 3 and the center of the dimension (width dimension) of the electrode 4 in the direction orthogonal to the length direction of the electrode 4.

In the present preferred embodiment, since the Z-cut piezoelectric layer is used, the direction orthogonal to the length direction of the electrodes 3, 4 is a direction orthogonal to a polarization direction of the piezoelectric layer 2. When a piezoelectric body with another cut angle is used as the piezoelectric layer 2, this does not apply. Here, the term "orthogonal" is not limited only to a strictly orthogonal case and may be substantially orthogonal (the angle formed between the direction orthogonal to the length direction of the electrodes 3, 4 and the polarization direction PZ1 is, for example, about 90°±10°).

A support member 8 is laminated via an electrically insulating layer 7 to the second principal surface 2*b* of the piezoelectric layer 2. As shown in FIG. 2, the electrically insulating layer 7 has a frame shape and has a cavity 7*a*, and the support member 8 has a frame shape and has a cavity 8*a*. With this configuration, an air gap 9 is provided. The air gap 9 is provided so as not to impede vibrations of an excitation region of the piezoelectric layer 2. In other words, the air gap 9 is provided on a side opposite to a side on which at least one pair of electrodes 3, 4 is provided in a region that at least partially overlaps a portion where the at least one pair of electrodes 3, 4 is provided when viewed in plan. Therefore, the support member 8 is laminated to the second principal surface 2*b* via the electrically insulating layer 7 at a location that does not overlap a portion where the at least one pair of electrodes 3, 4 is provided. The electrically insulating layer 7 does not need to be provided. Therefore, the support member 8 can be laminated directly or indirectly on the second principal surface 2*b* of the piezoelectric layer 2. The support member 8 may be provided not only at a location that does not overlap a portion where at least one pair of electrodes 3, 4 is provided but also at a location that overlaps the portion where the at least one pair of electrodes 3, 4 is provided in plan view. In this case, at a location that overlaps a portion where at least one pair of electrodes 3, 4 is provided in plan view, the air gap 9 is provided between the piezoelectric layer 2 and the support member 8.

The electrically insulating layer 7 is made of silicon oxide. Other than silicon oxide, an appropriate electrically insulating material, such as silicon oxynitride and alumina, may be used. The support member 8 is made of Si. The plane direction of a piezoelectric layer 2-side surface of Si may be (100) or may be (110) or (111). Preferably, high-resistance Si having a resistivity of higher than or equal to about 4 kΩ, is desirable. The support member 8 may also be made of an appropriate electrically insulating material or an appropriate semiconductor material.

The plurality of electrodes 3, 4 and the first and second busbars 5, 6 are made of an appropriate metal or alloy, such as Al and AlCu alloy. In the present preferred embodiment, the electrodes 3, 4 and the first and second busbars 5, 6 have a structure such that an Al film is laminated on a Ti film. An adhesion layer other than a Ti film may be used.

At the time of driving, an alternating-current voltage is applied between the plurality of electrodes 3 and the plurality of electrodes 4. More specifically, an alternating-current voltage is applied between the first busbar 5 and the second busbar 6. With this configuration, resonant characteristics that use bulk waves in the first thickness-shear mode, which are excited in the piezoelectric layer 2, can be obtained. In the acoustic wave device 1, when the thickness of the piezoelectric layer 2 is d and the distance between the centers of any adjacent electrodes 3, 4 of the plurality of pairs of electrodes 3, 4 is p, d/p is less than or equal to about 0.5. For this reason, bulk waves in the first thickness-shear mode are effectively excited, so good resonant characteristics are obtained. More preferably, d/p is less than or equal to about 0.24, and, in this case, further good resonant characteristics are obtained. When at least one of the electrodes 3, 4 is multiple as in the case of the present preferred embodiment, that is, when, where the electrodes 3, 4 are assumed as a paired electrode set, 1.5 pairs or more of the electrodes 3, 4 are provided, the distance p between the centers of the adjacent electrodes 3, 4 is an average distance of the distances between the centers of any adjacent electrodes 3, 4.

Since the acoustic wave device 1 of the present preferred embodiment has the above configuration, the quality factor is unlikely to decrease even when the number of pairs of the electrodes 3, 4 is reduced for the purpose of reducing the size. This is because energy can be enclosed even when the number of electrode fingers in each reflector is small. The reason why the reflector is not necessarily needed is because bulk waves in the first thickness-shear mode are used. The difference between Lamb waves used in the existing acoustic wave device and bulk waves in the first thickness-shear mode will be described with reference to FIGS. 3A and 3B.

Figure 3A:
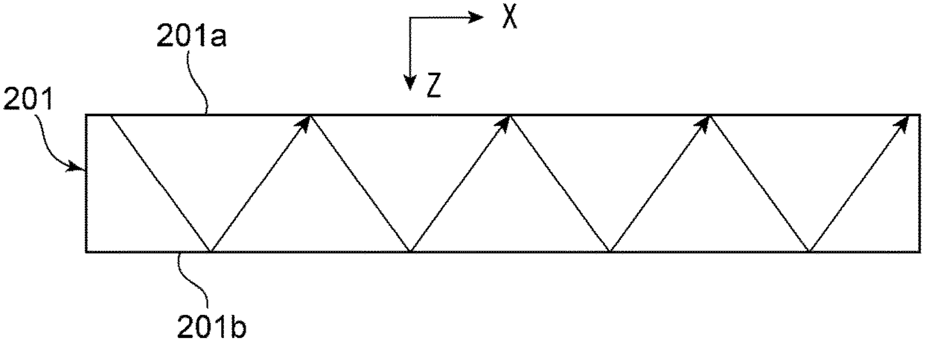
FIG. 3A is a schematic elevational cross-sectional view for illustrating Lamb waves that propagate in a piezoelectric film of an existing acoustic wave device.

FIG. 3A is a schematic elevational cross-sectional view for illustrating Lamb waves that propagate in a piezoelectric film of an acoustic wave device as described in Japanese Unexamined Patent Application Publication No. 2012-257019. Here, the waves propagate in a piezoelectric film 201 as indicated by the arrows. Here, in the piezoelectric film 201, a first principal surface 201*a* and a second principal surface 201*b* are opposed to each other, and a thickness direction connecting the first principal surface 201*a* and the second principal surface 201*b* is a Z direction. An X direction is a direction in which electrode fingers of an interdigital transducer electrode are arranged. As shown in FIG. 3A, for Lamb waves, the waves propagate in the X direction as shown in the drawing. The waves are plate waves, so the piezoelectric film 201 vibrates as a whole; however, the waves propagate in the X direction. Therefore, resonant characteristics are obtained by arranging a reflector on each side. For this reason, when the size is reduced, that is, when the number of pairs of electrode fingers of each of the reflectors is reduced, a wave propagation loss occurs, and the quality factor decreases.

Figure 3B:
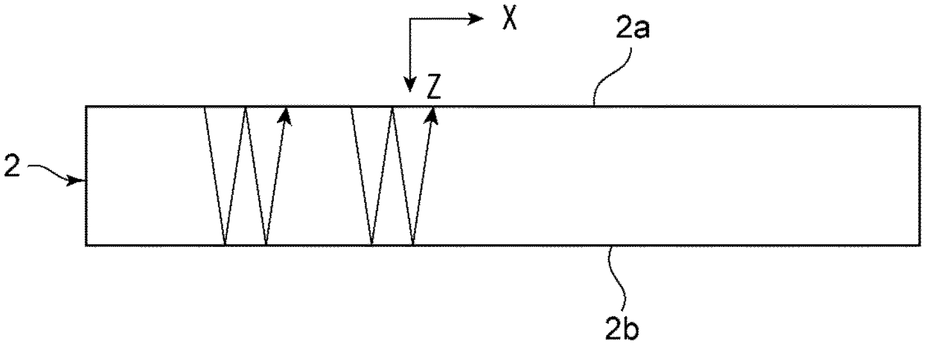
FIG. 3B is a schematic elevational cross-sectional view for illustrating bulk waves in a first thickness-shear mode, that propagate in a piezoelectric layer in the acoustic wave device according to a preferred embodiment of the present invention.

In contrast, as shown in FIG. 3B, in the acoustic wave device of the present preferred embodiment, a vibration displacement is caused in the thickness-shear direction, so the waves propagate substantially in the direction connecting the first principal surface 2*a* and the second principal surface 2*b* of the piezoelectric layer 2, that is, the Z direction, and resonate. In other words, the X-direction components of the waves are significantly smaller than the Z-direction components. Since the resonant characteristics are obtained from the propagation of the waves in the Z direction, a reflector is not necessarily needed. Therefore, even when the number of pairs of electrodes including the electrodes 3, 4 is reduced to reduce the size, the quality factor is unlikely to decrease.

Figure 4:
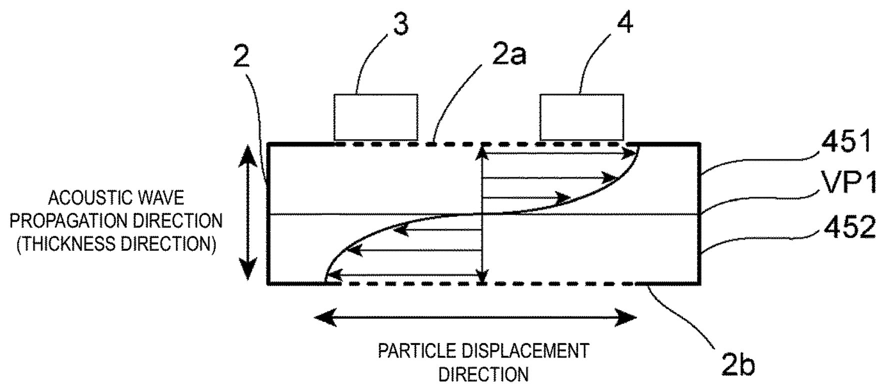
FIG. 4 is a diagram of an amplitude direction of the bulk waves in the first thickness-shear mode.

As shown in FIG. 4, the amplitude direction of the bulk waves in the first thickness-shear mode is opposite between a first region 451 included in the excitation region of the piezoelectric layer 2 and a second region 452 included in the excitation region. FIG. 4 schematically shows bulk waves when a voltage with which the electrodes 4 are higher in potential than the electrodes 3 is applied between the electrodes 3 and the electrodes 4. The first region 451 is a region in the excitation region between the first principal surface 2*a* and a virtual plane VP1 that is orthogonal to the thickness direction of the piezoelectric layer 2 and that divides the piezoelectric layer 2 into two. The second region 452 is a region in the excitation region between the virtual plane VP1 and the second principal surface 2*b*.

As described above, in the acoustic wave device 1, at least one pair of electrodes including the electrode 3 and the electrode 4 is disposed; however, the waves are not caused to propagate in the X direction, so the number of pairs of electrodes including the electrodes 3, 4 does not necessarily need to be multiple. In other words, at least one pair of electrodes just needs to be provided.

For example, the electrode 3 is an electrode connected to a hot potential, and the electrode 4 is an electrode connected to a ground potential. Of course, the electrode 3 may be connected to a ground potential, and the electrode 4 may be connected to a hot potential. In the present preferred embodiment, each of the at least one pair of electrodes is an electrode connected to a hot potential or an electrode connected to a ground potential as described above, and no floating electrode is provided.

Figure 5:
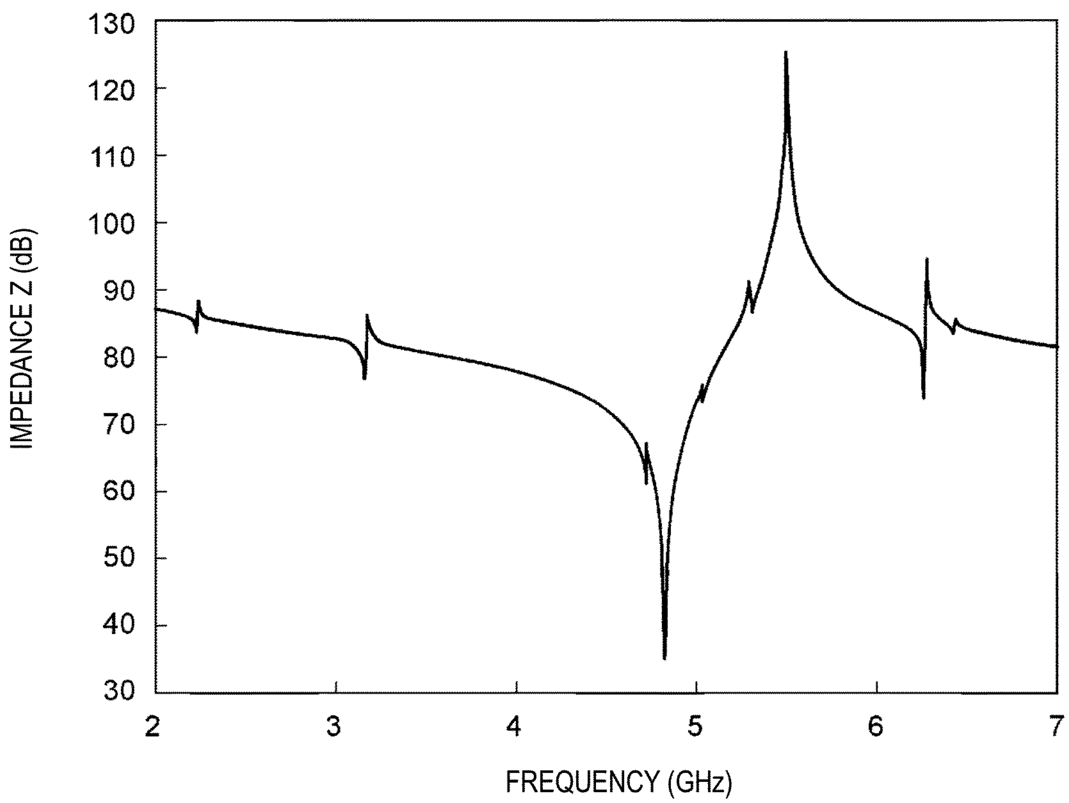
FIG. 5 is a graph of the resonant characteristics of the acoustic wave device according to a preferred embodiment of the present invention.

FIG. 5 is a graph of an example of the resonant characteristics of the acoustic wave device 1 according to the first preferred embodiment. The design parameters of the acoustic wave device 1 having the resonant characteristics are as follows.

The piezoelectric layer 2 is made of $LiNbO_3$ with Euler angles of (0°, 0°, 90°) and has a thickness of about 400 nm.

When viewed in the direction orthogonal to the length direction of the electrodes 3 and the electrodes 4, the length of a region in which the electrodes 3 and the electrodes 4 overlap, that is, the excitation region, is about 40 μm, the number of pairs of electrodes including the electrodes 3, 4 is 21, the distance between the centers of the electrodes is about 3 μm, and the width of each of the electrodes 3, 4 is about 500 nm. Therefore, d/p is 0.133 . . . .

The electrically insulating layer 7 is a silicon oxide film having a thickness of about 1 μm.

The support member 8 is made of Si.

The length of the excitation region is the dimension of the excitation region along the length direction of the electrodes 3, 4.

In the present preferred embodiment, the distance between any adjacent electrodes of the pairs of electrodes including the electrodes 3, 4 is equal among all the plurality of pairs. In other words, the electrodes 3 and the electrodes 4 are disposed at a constant pitch.

As is apparent from FIG. 5, although no reflectors are provided, good resonant characteristics with a fractional band width of about 12.5% are obtained.

Incidentally, when the thickness of the piezoelectric layer 2 is d and the distance between the centers of the electrodes 3 and the electrodes 4 is p, d/p is less than or equal to about 0.5 and preferably less than or equal to about 0.24 in the present preferred embodiment as described above. This will be described with reference to FIG. 6A and FIG. 6B.

Figure 6A:
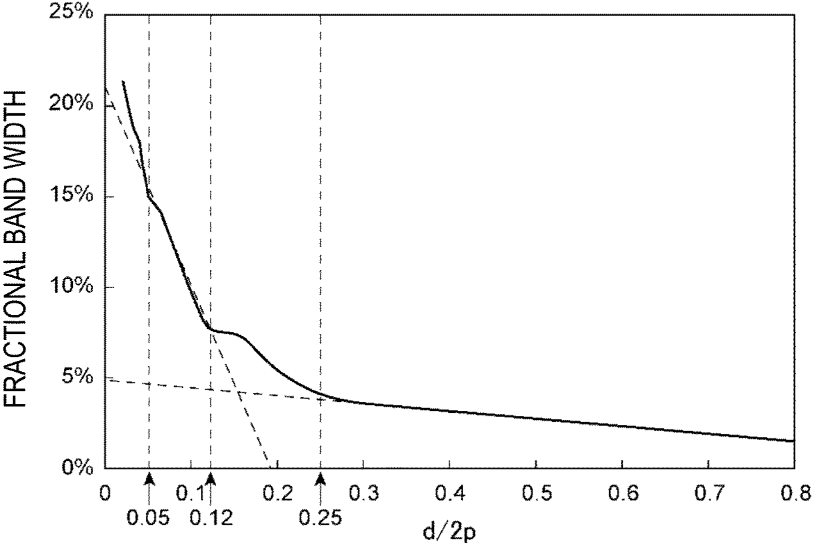
FIG. 6A is a graph of the relationship between d/2p and fractional band width of a resonator when the distance between the centers of adjacent electrodes or an average distance of distances between the centers of the adjacent electrodes is p and the thickness of the piezoelectric layer is d.
Figure 6B:
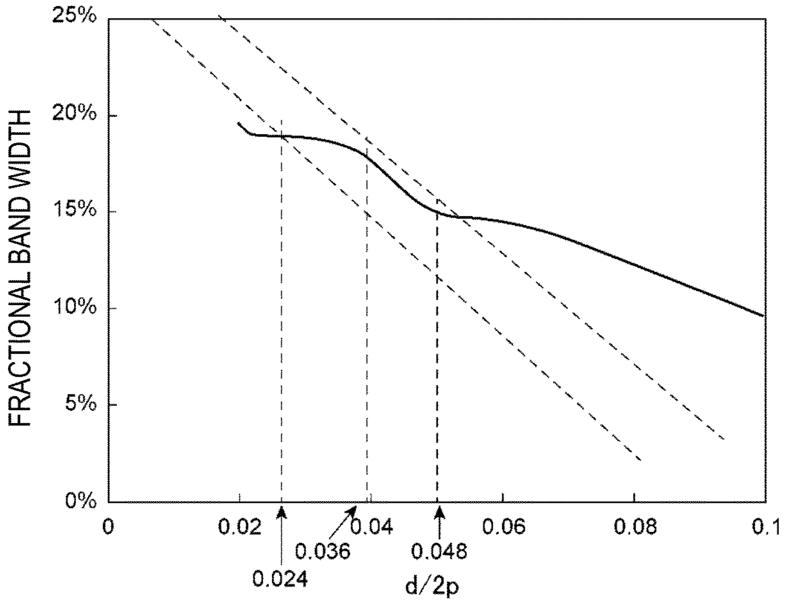
FIG. 6B is a graph of the relationship between d/2p and fractional band width of a resonator when the distance between the centers of adjacent electrodes or an average distance of distances between the centers of the adjacent electrodes is p and the thickness of the piezoelectric layer is d.

A plurality of acoustic wave devices is obtained while d/2p is changed as in the case of the acoustic wave device having the resonant characteristics shown in FIG. 5. FIGS. 6A and 6B are graphs showing the relationship between d/2p and the fractional band width of the acoustic wave device serving as a resonator.

As is apparent from FIG. 6A, when d/2p exceeds about 0.25, that is, d/p>0.5, the fractional band width is lower than about 5% even when d/p is adjusted. In contrast, in the case where d/2p≤0.25, that is, d/p≤0.5, d/p is changed within the range, the fractional band width can be set to about 5% or higher, that is, a resonator having a high coupling coefficient is provided. In the case where d/2p is lower than or equal to about 0.12, that is, d/p is less than or equal to about 0.24, the fractional band width can be increased to about 7% or higher. In addition, when d/p is adjusted within the range, a resonator having a further wide fractional band width is obtained, so a resonator having a further high coupling coefficient is achieved. Therefore, it is discovered that, as in the case of the modification of the first preferred embodiment of the present application, when d/p is set to about 0.5 or less, a resonator that uses bulk waves in the first thickness-shear mode with a high coupling coefficient can be provided.

In addition, as is apparent from FIG. 6A, when d/p≤0.10, the fractional band width can be further increased by further increasing the coupling coefficient when d/p is changed within the range of 0<d/p≤0.10.

FIG. 6B is a partially enlarged graph of FIG. 6A. As shown in FIG. 6B, when d/p≤0.096, the fractional band width can be further increased by further increasing the coupling coefficient when d/p is changed within the range d/p≤0.096. When 0.048≤d/p≤0.072, the fractional band width can be further increased by further increasing the coupling coefficient.

As described above, at least one pair of electrodes may be one pair, and, in the case of one pair of electrodes, p is defined as the distance between the centers of the adjacent electrodes 3, 4. In the case of 1.5 pairs or more of electrodes, an average distance of the distances between the centers of any adjacent electrodes 3, 4 just needs to be defined as p.

Figure 7:
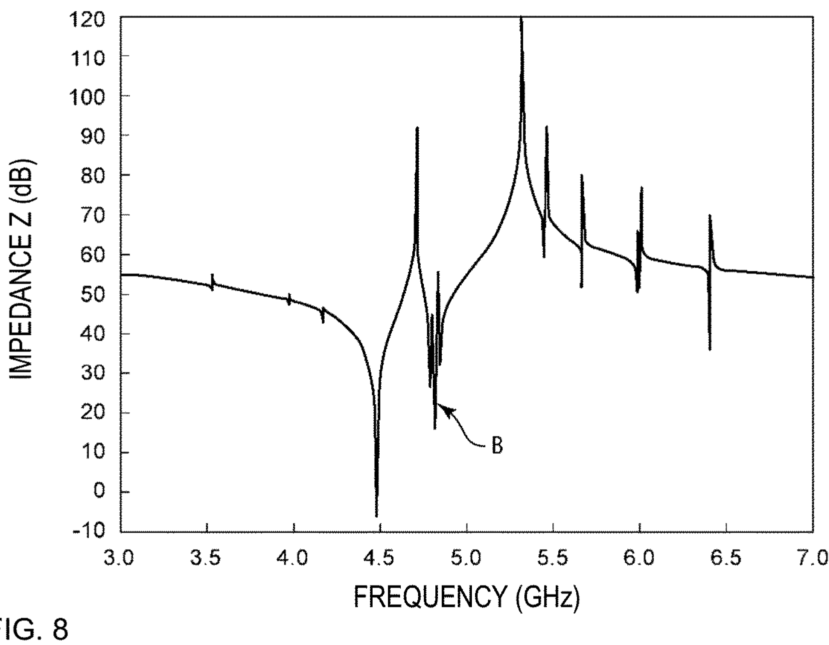
FIG. 7 is a graph of the resonant characteristics of an acoustic wave device according to a reference example in which spurious is appearing.

In the acoustic wave device 1, preferably, in the plurality of electrodes 3, 4, it is desirable that a metallization ratio MR of any adjacent electrodes 3, 4 to the excitation region that is a region in which the any adjacent electrodes 3, 4 overlap when viewed in the opposed direction satisfy MR≤1.75(d/p)+0.075. In this case, spurious is effectively reduced. This will be described with reference to FIG. 7 and FIG. 8. FIG. 7 is a reference graph of an example of the resonant characteristics of the acoustic wave device 1. The spurious indicated by the arrow B appears between a resonant frequency and an anti-resonant frequency. Here, d/p is set to about 0.08, and the Euler angles of $LiNbO_3$ are set to (0°, 0°, 90°). The metallization ratio MR is set to about 0.35.

The metallization ratio MR will be described with reference to FIG. 1B. In the electrode structure of FIG. 1B, when focusing on one pair of electrodes 3, 4, it is assumed that only the one pair of electrodes 3, 4 is provided. In this case, the portion surrounded by the alternate long and short dashed line C is an excitation region. The excitation region includes, when the electrode 3 and the electrode 4 are viewed in the direction orthogonal to the length direction of the electrodes 3, 4, that is, the opposed direction, a region of the electrode 3, overlapping the electrode 4, a region of the electrode 4, overlapping the electrode 3, and a region in which the electrode 3 and the electrode 4 overlap in a region between the electrode 3 and the electrode 4. Then, the area of the electrodes 3, 4 in the excitation region C to the area of the excitation region is a metallization ratio MR. In other words, the metallization ratio MR is the ratio of the area of a metallization portion to the area of the excitation region.

When a plurality of pairs of electrodes is provided, the ratio of a metallization portion included in the total excitation region to the total area of the excitation region just needs to be set for MR.

Figure 8:
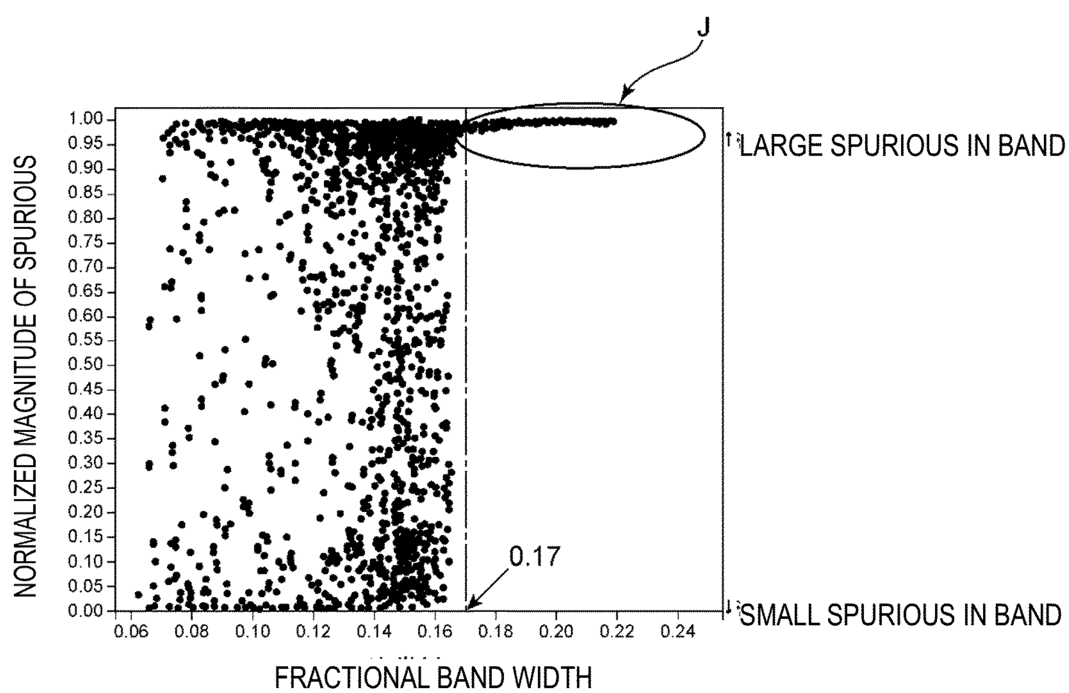
FIG. 8 is a graph of the relationship between fractional band width and the normalized magnitude of spurious.

FIG. 8 is a graph of the relationship between a fractional band width in the case where a large number of acoustic wave resonators are provided and a phase rotation amount of impedance of spurious normalized by 180 degrees as the magnitude of spurious in accordance with the present preferred embodiment. For fractional band width, the film thickness of the piezoelectric layer and the dimensions of the electrodes are variously changed and adjusted. FIG. 8 is a result in the case where the piezoelectric layer made of Z-cut $LiNbO_3$ is used, and similar tendency is obtained when a piezoelectric layer with another cut angle is used as well.

In a region surrounded by the ellipse J in FIG. 8, the spurious is about 1.0 and large. As is apparent from FIG. 8, when the fractional band width exceeds about 0.17, that is, about 17%, a large spurious having a spurious level of greater than or equal to one appears in a pass band even when parameters composing the fractional band width are changed. In other words, as in the case of the resonant characteristics shown in FIG. 7, a large spurious indicated by the arrow B appears in the band. Thus, the fractional band width is preferably lower than or equal to about 17%. In this case, spurious can be reduced by adjusting the film thickness of the piezoelectric layer 2, the dimensions of the electrodes 3, 4, and the like.

Figure 9:
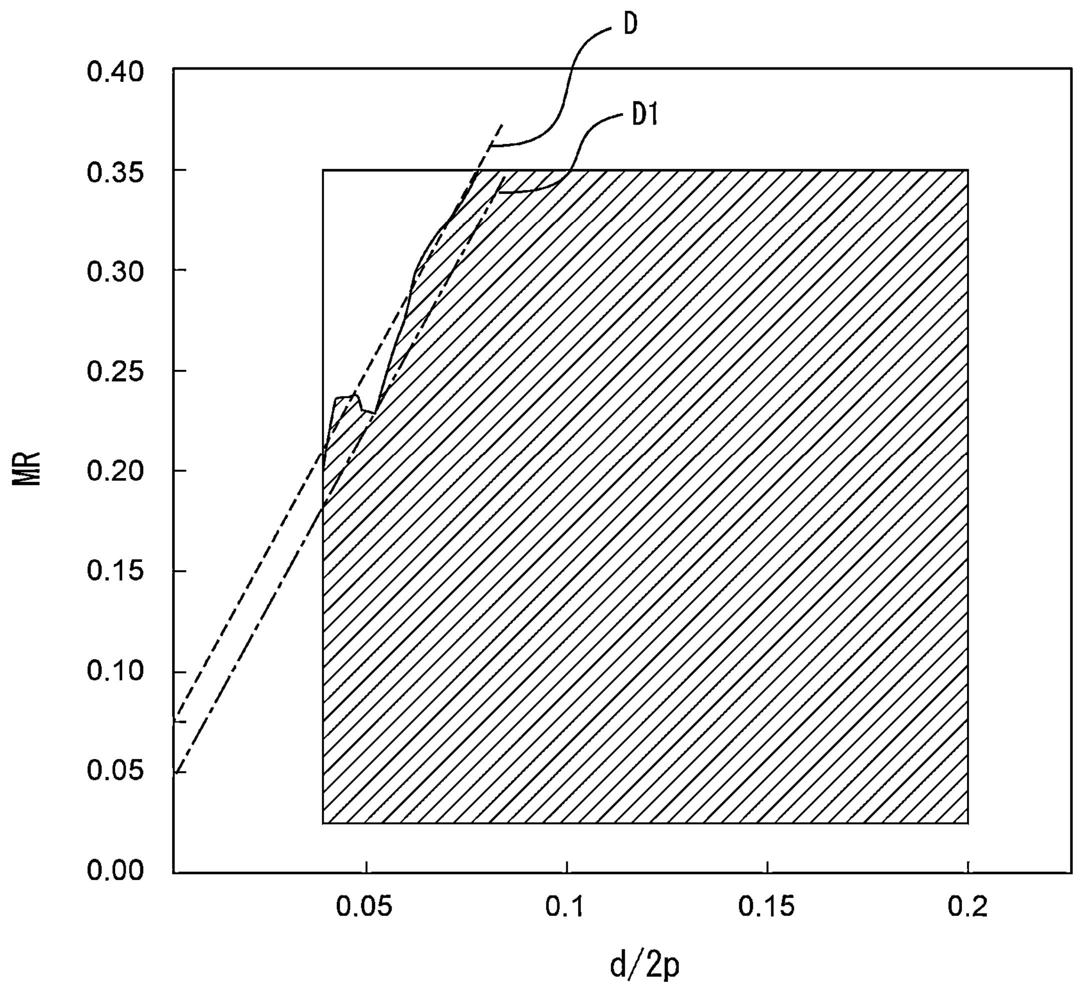
FIG. 9 is a graph of the relationship among d/2p, metallization ratio MR, and fractional band width.

FIG. 9 is a graph of the relationship among d/2p, metallization ratio MR, and fractional band width. In the above-described acoustic wave device, various acoustic wave devices of which d/2p and MR are different are provided, and the fractional band widths are measured. The hatched portion to the right-hand side of the dashed line D in FIG. 9 is a region in which the fractional band width is lower than or equal to about 17%. A boundary between the hatched region and a non-hatched region is expressed by MR=3.5(d/2p)+0.075. In other words, MR=1.75(d/p)+0.075. Therefore, preferably, MR≤1.75(d/p)+0.075. In this case, the fractional band width is easily set to about 17% or lower. More preferably, this is the region to the right-hand side of MR=3.5(d/2p)+0.05 indicated by the alternate long and short dashed line D1 in FIG. 9. In other words, when MR≤1.75(d/p)+0.05, the fractional band width is reliably set to about 17% or lower.

Figure 10:
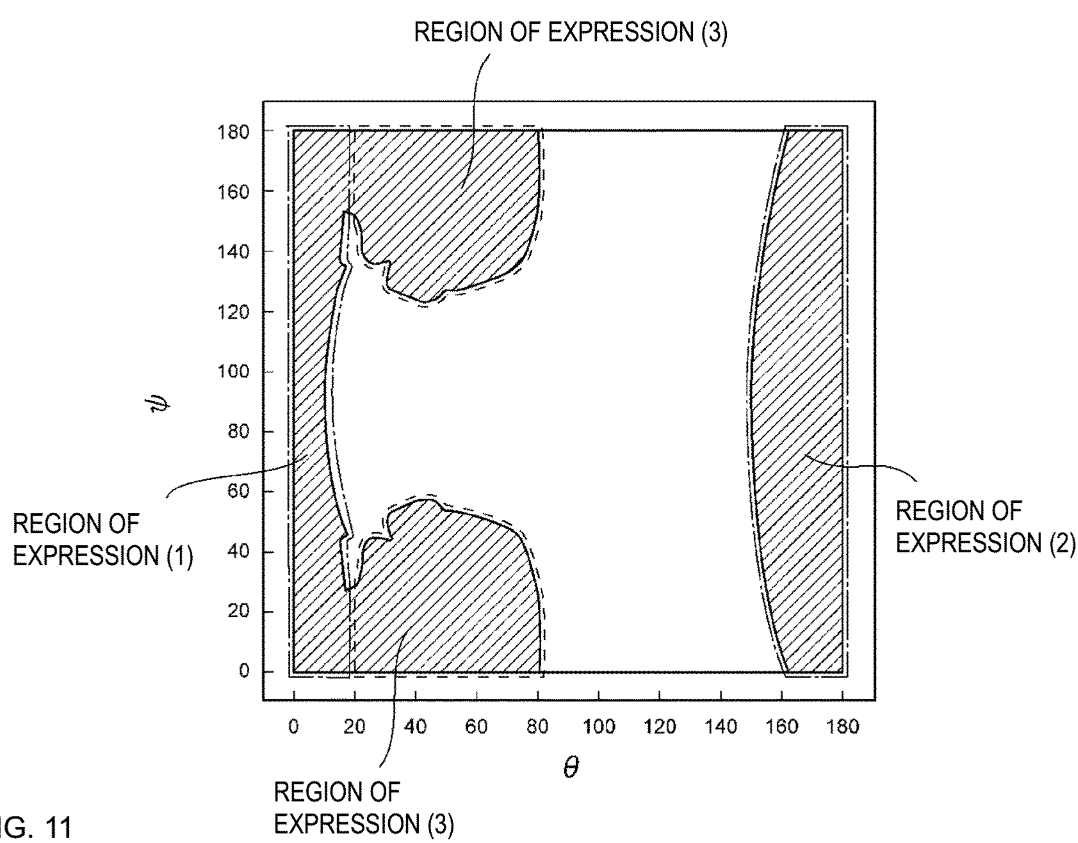
FIG. 10 is a diagram of a map of a fractional band width when d/p is brought close to zero without limit in $LiNbO_3$ with Euler angles of (0°, θ, ψ).

FIG. 10 is a diagram of a map of a fractional band width for the Euler angles (0°, θ, ψ) of $LiNbO_3$ when d/p is brought close to zero without limit. The hatched portions in FIG. 10 are regions E, F, G, H in which a fractional band width of at least about 5% or higher is obtained, When the range of the regions E, F, G, H is approximated, the range is expressed by the following expression (1), expression (2), and expression (3).

$$(0° \pm 10°,\ 0° \text{ to } 20°,\ \text{any } \psi) \qquad (1)\ \text{Region E}$$

$$\left(0° \pm 10°,\ 20° \text{ to } 80°,\ 0° \text{ to } 60°\left(1-(\theta-50)^2/900\right)^{1/2}\right) \text{ or } \left(0° \pm 10°,\ 20° \text{ to } 80°,\ \left[180° - 60°\left(1-(\theta-50)^2/900\right)^{1/2}\right] \text{ to } 180°\right) \qquad (2)\ \text{Region F or G}$$

$$\left(0° \pm 10°,\ \left[180° - 30°\left(1-(\psi-90)^2/8100\right)^{1/2}\right] \text{ to } 180°,\ \text{any } \psi\right) \qquad (3)\ \text{Region H}$$

Therefore, in the case of the range of Euler angles of the above expression (1), expression (2), or expression (3), the fractional band width is sufficiently widened, and it is preferable.

As described above, in the acoustic wave device according to the first preferred embodiment and modification thereof, even when the number of electrode fingers of each of the reflectors is reduced, good resonant characteristics are obtained. Therefore, even when the size is reduced, it is possible to implement a high quality factor. Hereinafter, other preferred embodiments and modifications of the present invention will be described.

Figure 11:
FIG. 11 is an elevational cross-sectional view with part cut away for illustrating an acoustic wave device according to a second preferred embodiment of the present invention.
Figure 11:
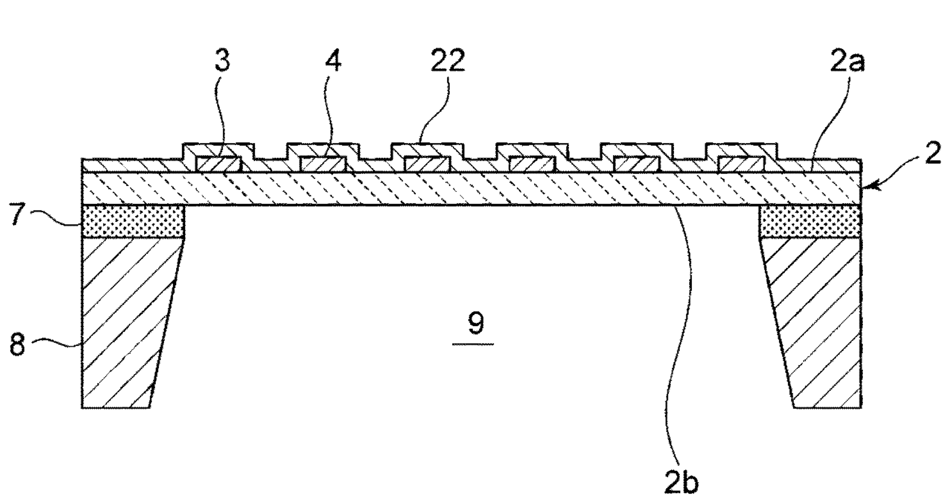

FIG. 11 is an elevational cross-sectional view with part cut away of an acoustic wave device according to a second preferred embodiment. In the acoustic wave device 21, a protective film 22 is laminated on the first principal surface 2*a* of the piezoelectric layer 2 so as to cover at least one pair of electrodes 3, 4. An electrically insulating material, such as silicon oxide and silicon oxynitride, may be suitably used as the protective film 22. The protective film 22 also covers gap regions between the electrodes 3 and the electrodes 4 and may partially cover the gap regions.

Figure 12:
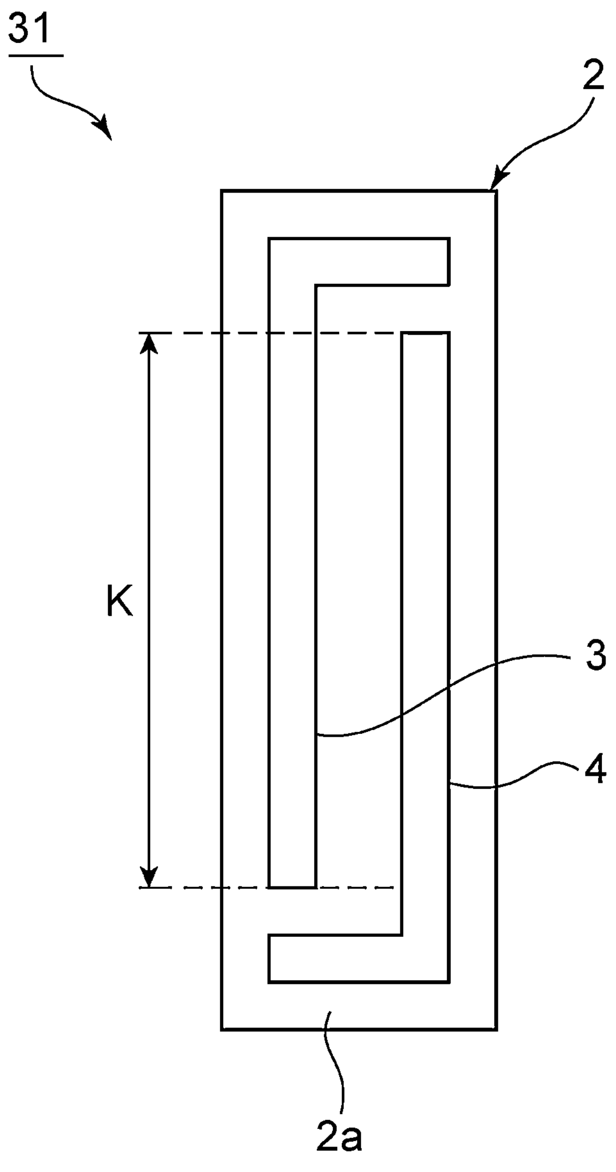
FIG. 12 is a plan view of an acoustic wave device according to a third preferred embodiment of the present invention.

FIG. 12 is a plan view of an acoustic wave device according to a third preferred embodiment. In the acoustic wave device 31, one pair of electrodes having the electrode 3 and the electrode 4 is provided on the first principal surface 2*a* of the piezoelectric layer 2. In FIG. 12, K is the length of an excitation region. As described above, in an acoustic wave device according to a preferred embodiment of the present invention, the number of pairs of electrodes may be one. In this case as well, when d/p is less than or equal to about 0.5, bulk waves in the first thickness-shear mode can be effectively excited.

Figure 13:
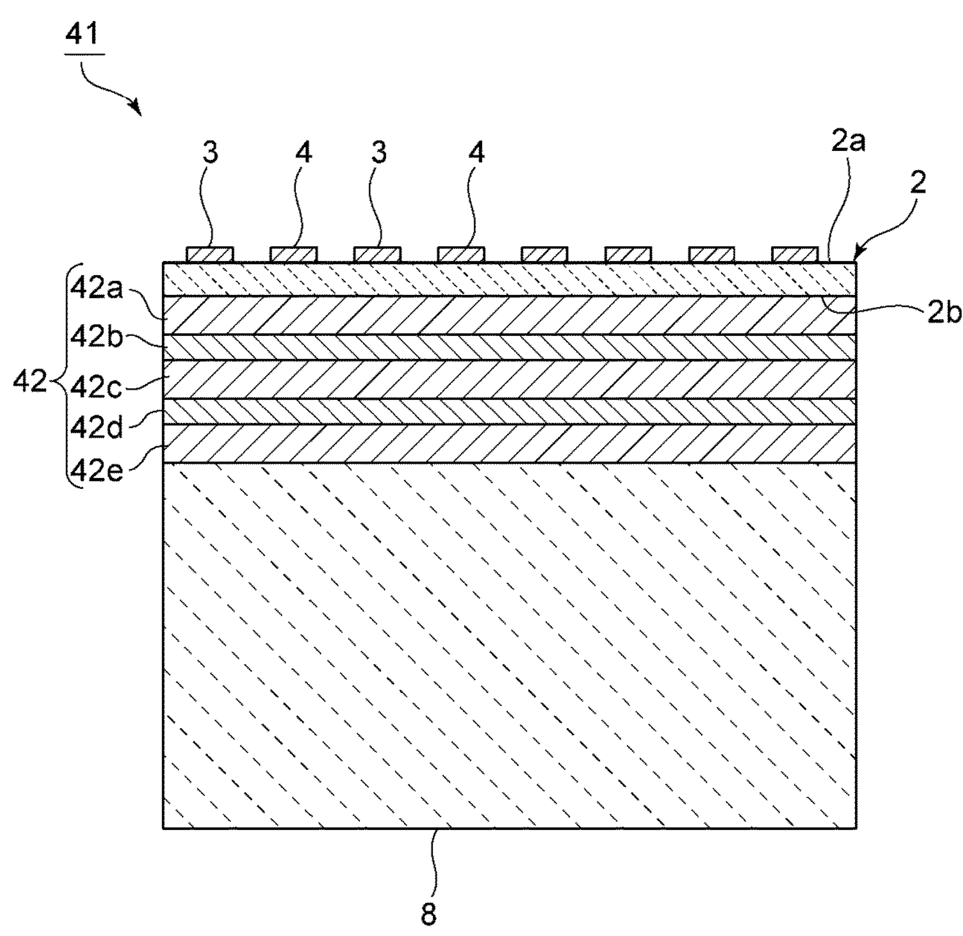
FIG. 13 is an elevational cross-sectional view of an acoustic wave device according to a fourth preferred embodiment of the present invention.

FIG. 13 is an elevational cross-sectional view of an acoustic wave device according to a fourth preferred embodiment. In the acoustic wave device 41, an acoustic multilayer film 42 is laminated on the second principal surface 2*b* of the piezoelectric layer 2. The acoustic multilayer film 42 has a multilayer structure of low acoustic impedance layers 42*a*, 42*c*, 42*e* having a relatively low acoustic impedance and high acoustic impedance layers 42*b*, 42*d* having a relatively high acoustic impedance. When the acoustic multilayer film 42 is used, bulk waves in the first thickness-shear mode can be enclosed in the piezoelectric layer 2 without using the air gap 9 in the acoustic wave device 1. In this acoustic wave device 41 as well, resonant characteristics based on bulk waves in the first thickness-shear mode can be obtained by setting d/p to about 0.5 or less. In the acoustic multilayer film 42, the number of the laminated low acoustic impedance layers and the number of the laminated high acoustic impedance layers are not limited. At least one of the high acoustic impedance layers just needs to be disposed on the side farther from the piezoelectric layer 2 than the low acoustic impedance layers.

The low acoustic impedance layers 42*a*, 42*c*, 42*e* and the high acoustic impedance layers 42*b*, 42*d* may be made of a material selected as needed as long as the relationship among the acoustic impedance layers is satisfied. Examples of the material of the low acoustic impedance layers 42*a*, 42*c*, 42*e* may include silicon oxide and silicon oxynitride. Examples of the material of the high acoustic impedance layers 42*b*, 42*d* may include alumina, silicon nitride, and metals.

Figure 14A:
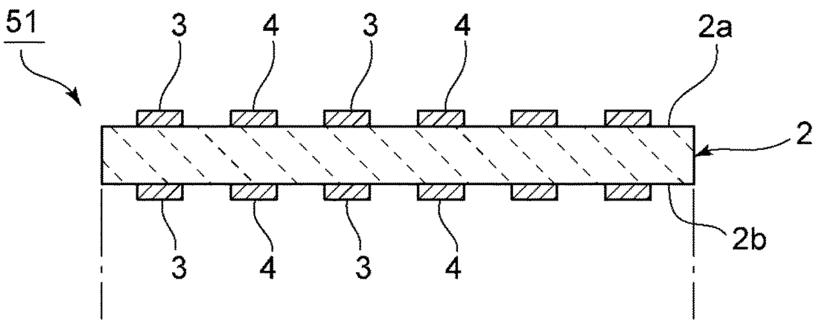
FIG. 14A is an elevational cross-sectional view for illustrating an acoustic wave device according to a fifth preferred embodiment of the present invention.
Figure 14B:
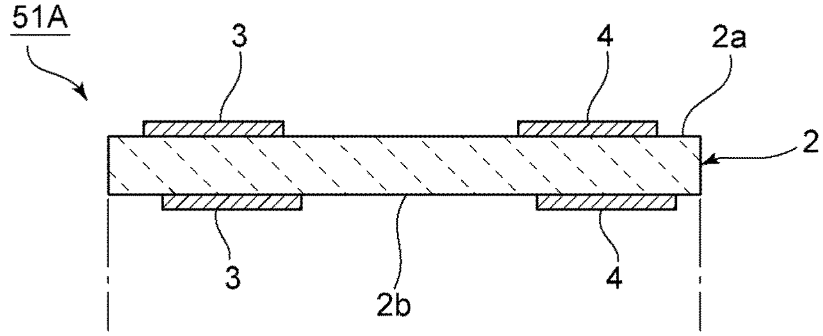
FIG. 14B is an elevational cross-sectional view of a modification of the fifth preferred embodiment of the present invention.

FIG. 14A is an elevational cross-sectional view for illustrating an acoustic wave device according to a fifth preferred embodiment, and FIG. 14B is an elevational cross-sectional view of a modification of the fifth preferred embodiment.

FIG. 14A shows part of the acoustic wave device according to the fifth preferred embodiment, that is, only a portion in which the piezoelectric layer 2 and at least one pair of electrodes 3, 4 are provided. In the acoustic wave device 51 of the fifth preferred embodiment, at least one pair of electrodes 3, 4 is provided on the first principal surface 2*a* of the piezoelectric layer 2. At least one pair of electrodes 3, 4 is also provided on the second principal surface 2*b*. In this way, at least one pair of electrodes may also be provided on the second principal surface 2*b* side. The electrodes 3, 4 provided on the second principal surface 2*b* are preferably provided so as to overlap the electrodes 3, 4 on the first principal surface 2*a* via the piezoelectric layer 2.

Of course, as in the case of an acoustic wave device 51A of the modification shown in FIG. 14B, the electrodes 3, 4 on the first principal surface 2*a* may partially overlap the electrodes 3, on the second principal surface 2*b*. In other words, the electrodes 3, 4 on the first principal surface 2*a* and the electrodes 3, 4 on the second principal surface 2*b* just need to at least partially overlap each other.

Although not shown in FIG. 14A, the acoustic wave device 51 is configured similarly to the acoustic wave device 1 except the piezoelectric layer 2 and the electrodes 3, 4. Therefore, as in the case of the acoustic wave device 1, good resonant characteristics with bulk waves in the first thickness-shear mode can be obtained, so it is possible to increase the quality factor even when the size is reduced.

Figure 15A:
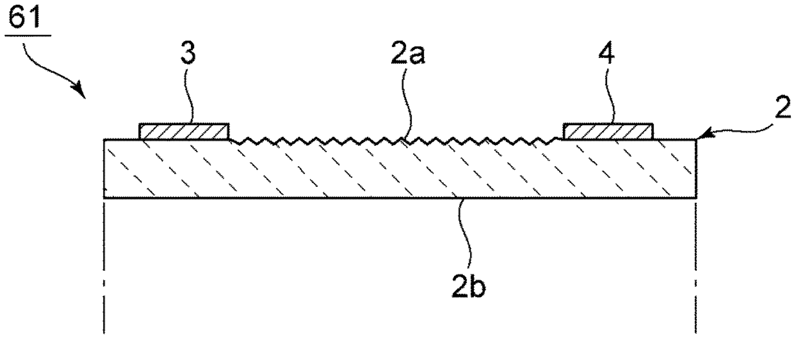
FIG. 15A is an elevational cross-sectional view for illustrating an acoustic wave device according to a sixth preferred embodiment of the present invention.
Figure 15B:
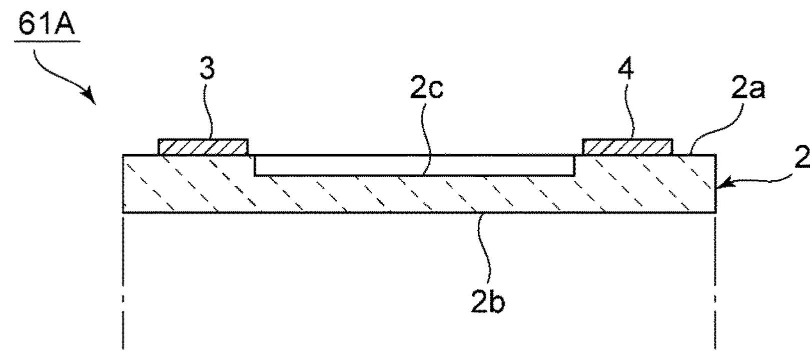
FIG. 15B is an elevational cross-sectional view of a modification of the sixth preferred embodiment.
Figure 15C:
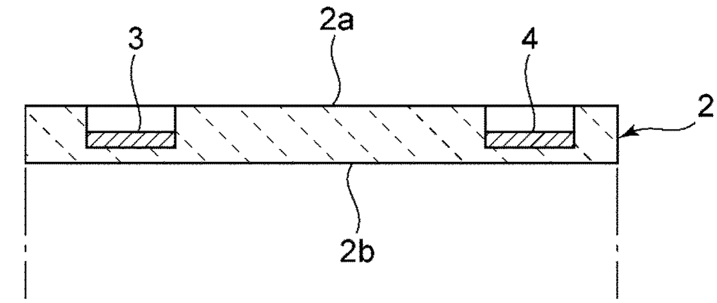
FIG. 15C is an elevational cross-sectional view of another modification of the sixth preferred embodiment of the present invention.

FIG. 15A is an elevational cross-sectional view for illustrating an acoustic wave device according to a sixth preferred embodiment, and FIGS. 15B and 15C are elevational cross-sectional views of modifications of the sixth preferred embodiment. FIGS. 15A to 15C, as in the case of FIG. 14A, show only a portion where the piezoelectric layer 2 and at least one pair of electrodes 3, 4 of the acoustic wave device 61 and 61A are provided. In the acoustic wave device 61, the first principal surface 2*a* of the piezoelectric layer 2 has a rough surface. In this case, it is possible to adjust the frequency by adjusting the degree of the rough surface. The other configuration of the acoustic wave device 61 is similar to that of the acoustic wave device 1 of the first preferred embodiment.

In an acoustic wave device 61A of the modification shown in FIG. 15B, a gap portion between the electrode 3 and the electrode 4 is ground to provide a recessed portion 2*c*. It is also possible to adjust the frequency by adjusting the size or depth of the recessed portion 2*c*.

On the other hand, in further another modification shown in FIG. 15C, portions of the piezoelectric layer 2 under the electrodes 3, 4 are ground. In this case, the electromechanical coupling coefficient can be increased, and the fractional band width can be expanded.

In the acoustic wave device 1, each of the electrodes 3, 4 has a rectangular shape with a length direction. However, in preferred embodiments of the present invention, the planar shape of at least one pair of electrodes is not limited. At least one pair of electrodes 3, 4 each may have a shape of an isosceles trapezoid. At least one pair of electrodes 3, 4 is not limited to an isosceles trapezoid and may have another trapezoidal shape. Alternatively, part of a trapezoid may be a curved shape.

The electrodes 3, 4 each may have a curved shape in plan view.

The electrodes 3, 4 each may have a shape with at least one recessed portion at its side. In addition, the shape of the recessed portion is not limited to a rectangular shape.

Figure 16A:
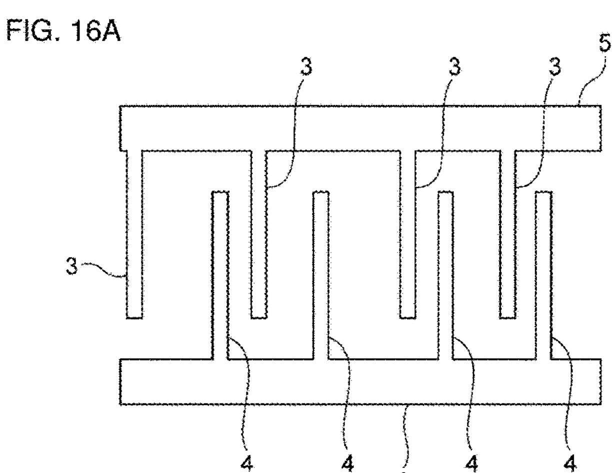
FIG. 16A is a plan view for illustrating a first modification of the electrode structure in the acoustic wave device according to a preferred embodiment of the present invention.

FIG. 16A is a plan view for illustrating a first modification of the electrode structure. In the first modification, the electrodes 3 and the electrodes 4 are disposed at a random pitch in the direction orthogonal to the length direction of the electrodes 3, 4. In other words, the plurality of electrodes 3, 4 that make up the plurality of pairs of electrodes 3, 4 is disposed at a constant pitch in the opposed direction of the electrodes 3, 4. In this way, when a plurality of pairs of electrodes including the electrodes 3, 4 is provided, the pitch of the plurality of electrodes 3, 4 may be random. The distance between the centers of the electrodes of each pair may be varied.

Figure 16B:
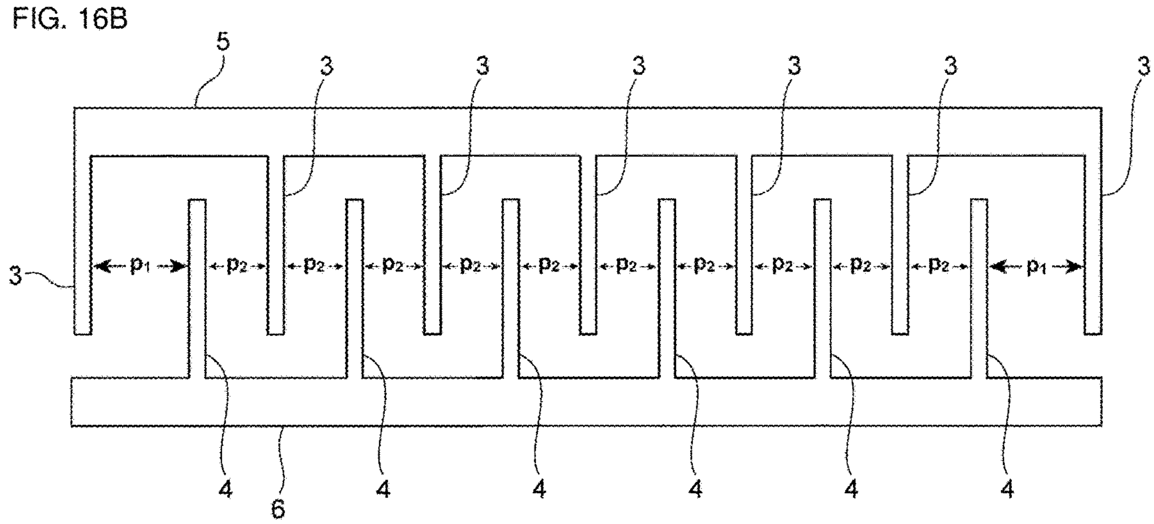
FIG. 16B is a plan view for illustrating a second modification of the electrode structure in the acoustic wave device according to a preferred embodiment of the present invention.

FIG. 16B is a plan view for illustrating a second modification of the electrode structure. In the second modification, the electrodes 3 and the electrodes 4 are disposed according to pitches $p_1$ and $p_2$. As shown in FIG. 16B, the pitch $p_1$ is a pitch on either end side of the interdigital transducer (IDT) electrode, and the pitch $p_2$ is a pitch on the middle section of the IDT electrode. In this preferred embodiment as shown in FIG. 16B, the pitch $p_1$ is greater than the pitch $p_2$. Thereby, ripple components can be reduced.

Figure 16C:
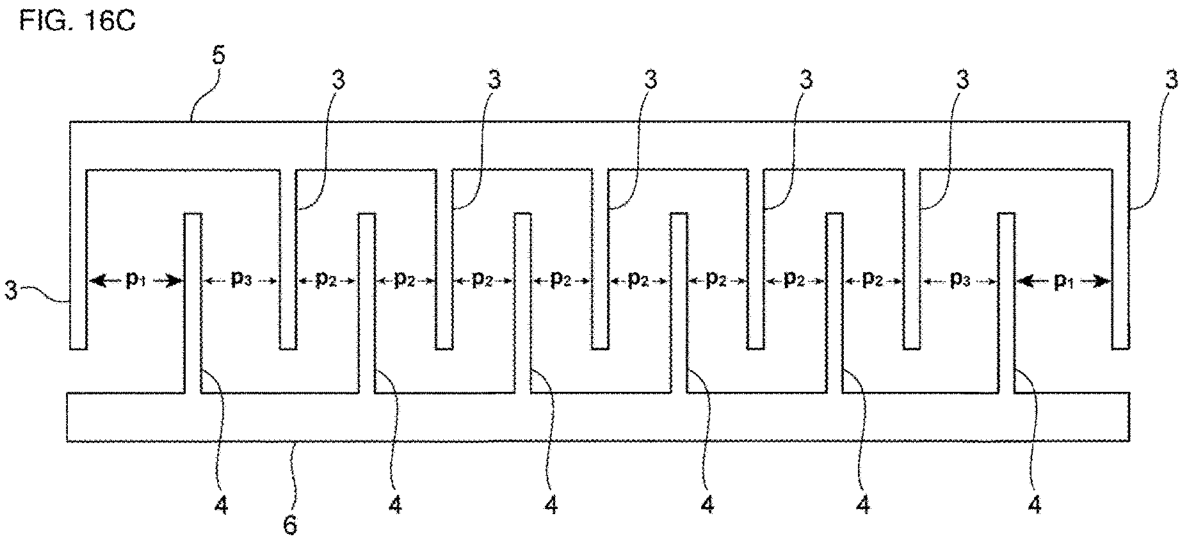
FIG. 16C is a plan view for illustrating a third modification of the electrode structure in the acoustic wave device according to a preferred embodiment of the present invention.

FIG. 16C is a plan view for illustrating a third modification of the electrode structure. In the third modification, the electrodes 3 and the electrodes 4 are disposed according to pitches $p_1$, $p_2$, and $p_3$. In this preferred embodiment as shown in FIG. 16C, the size of pitches have the relationship $p_1>p_3>p_2$. Thereby, ripple components can be reduced.

Figure 17:
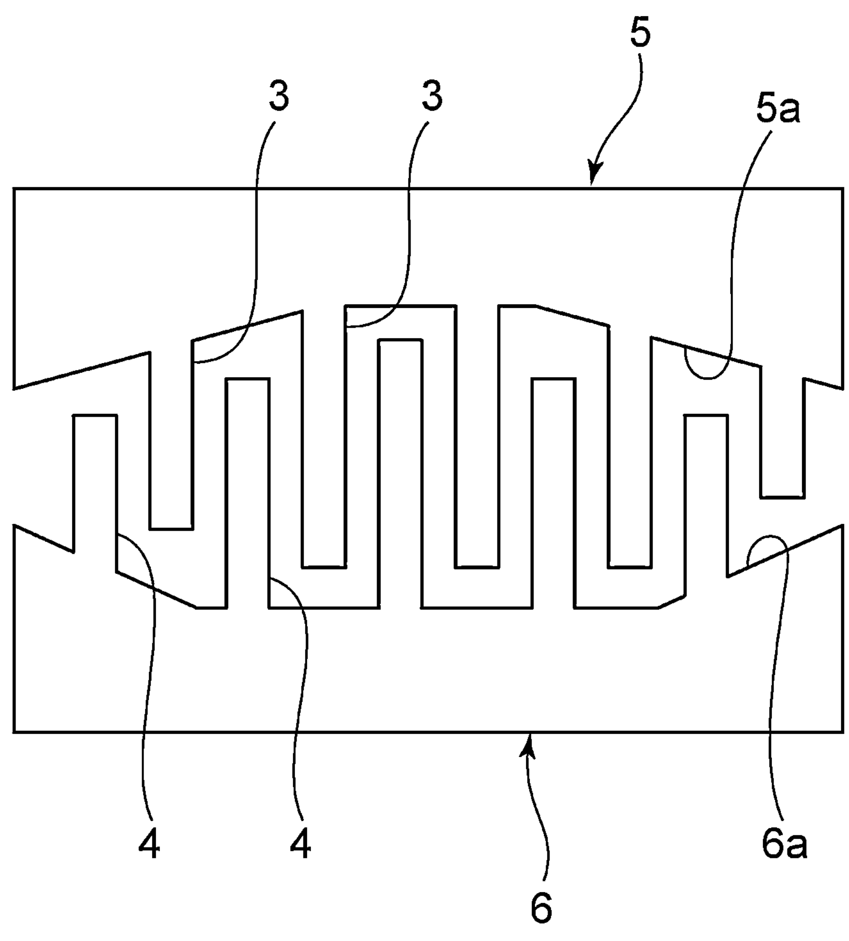
FIG. 17 is a plan view for illustrating a fourth modification of the electrode structure in the acoustic wave device according to a preferred embodiment of the present invention.

FIG. 17 is a plan view for illustrating a fourth modification of the electrode structure. In the fourth modification, a region in which the electrodes 3 and the electrodes 4 overlap when viewed in the direction orthogonal to the length direction of the electrodes 3, 4 changes from one end side of the first busbar 5 and the second busbar 6 toward the other side in FIG. 17. In other words, the length of the excitation region between any adjacent electrodes 3, 4 is varied. In this way, at least one excitation region of which the length is varied may be present.

In FIG. 17, in accordance with a change in the length of the excitation region, the inner end of each of the first and second busbars 5, 6 is inclined so as to be close to the other-side one of the second busbar 6 and the first busbar 5 in plan view. In this way, the inner end of each of the first busbar 5 and the second busbar 6, to which the electrodes 3 or the electrodes 4 are connected, may have an inclined portion.

Figure 18:
FIG. 18 is an elevational cross-sectional view of an acoustic wave device according to a seventh preferred embodiment of the present invention.
Figure 18:
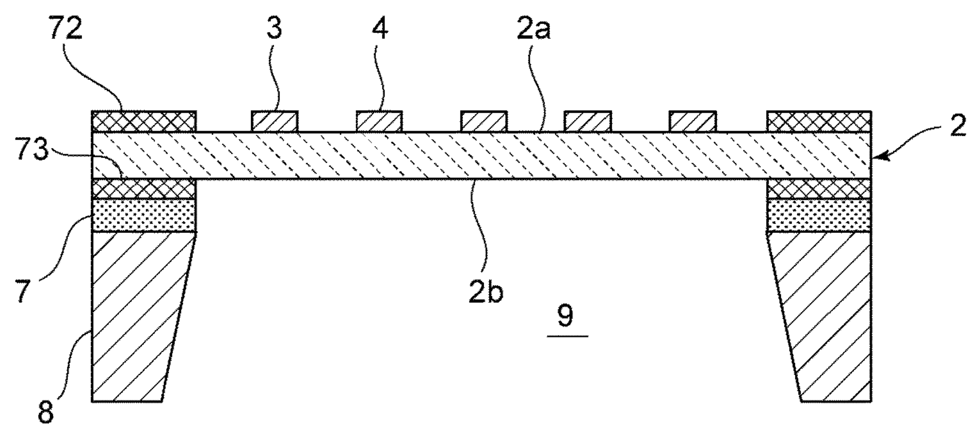

FIG. 18 is an elevational cross-sectional view of an acoustic wave device according to a seventh preferred embodiment. In the acoustic wave device 71, a mass addition film 72 is provided on the first principal surface 2*a* of the piezoelectric layer 2. A mass addition film 73 is also provided on the second principal surface 2*b*. The mass addition films 72, 73 are provided outside the excitation region, that is, outside a region in which the plurality of electrodes 3, 4 is disposed. The mass addition film 72 or the mass addition film 73 may be provided at a selected location outside the excitation region. In FIG. 18, the mass addition films 72, 73 are provided at a location that overlaps the electrically insulating layer 7. It is possible to easily adjust the frequency by providing the mass addition films 72, 73.

Only any one of the mass addition films 72, 73 may be provided. An electrical insulator, such as silicon oxide, silicon oxynitride, and alumina, a metal or an alloy of Al, or the like may be used as the material of the mass addition films 72, 73.

Figure 19:
FIG. 19 is an elevational cross-sectional view of a piezoelectric layer and a pair of electrodes in an eighth preferred embodiment of the present invention.
Figure 19:
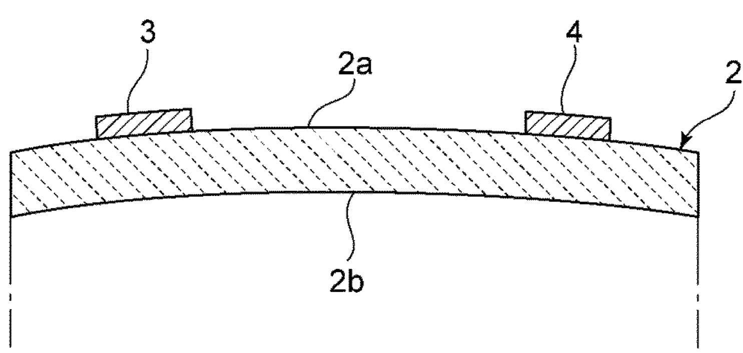

FIG. 19 is an elevational cross-sectional view for illustrating a piezoelectric layer and a pair of electrodes of an acoustic wave device according to an eighth preferred embodiment. In the acoustic wave device 81, the first principal surface 2*a* and the second principal surface 2*b* of the piezoelectric layer 2 each have a curved shape. In this way, the piezoelectric layer 2 does not need to be a flat plate-shaped piezoelectric film and may be partially curved.

Figures 20A, 20B, 20C, 20D:
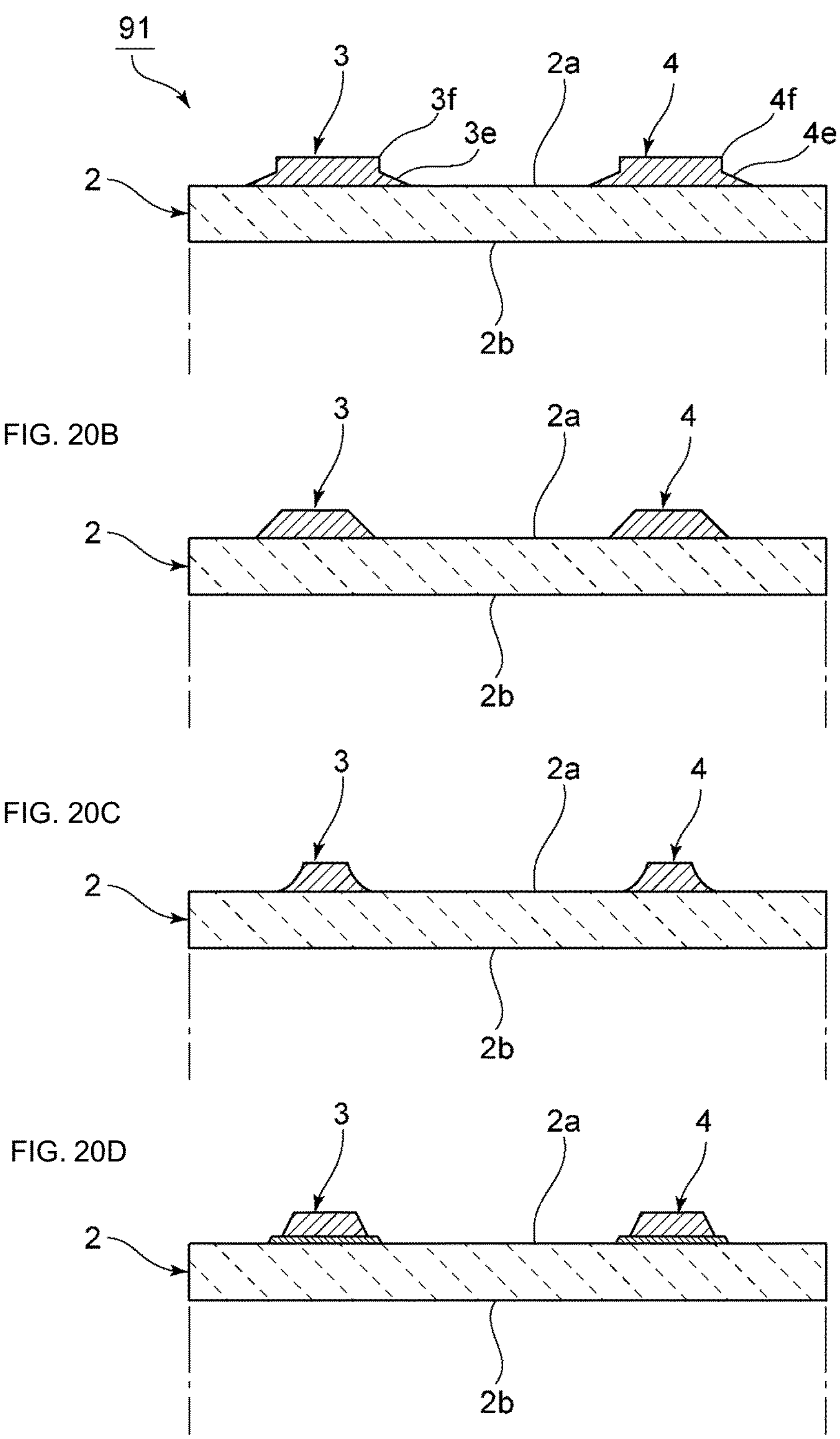
FIG. 20A is an elevational cross-sectional view of a piezoelectric layer and a pair of electrodes in a ninth preferred embodiment of the present invention.
FIGS. 20B to 20D are elevational cross-sectional views for illustrating modifications of the ninth preferred embodiment.

FIG. 20A is an elevational cross-sectional view for illustrating a piezoelectric layer and a pair of electrodes of an acoustic wave device according to a ninth preferred embodiment. In the acoustic wave device 91, the cross-sectional shape of each of at least one pair of electrodes 3, 4 has a deformed shape different from a rectangular shape. In other words, the electrode 3 has a wide portion 3*e* located on the first principal surface 2*a*, and a rectangular cross-section portion 3*f* provided on the wide portion 3*e*. The electrode 4 has a wide portion 4*e* located on the first principal surface 2*a*, and a rectangular section portion 4*f* provided on the wide portion 4*e*. The side surface of the wide portion 3*e* is tapered so as to narrow from the first principal surface 2*a* side toward the rectangular section portion 3*f* side. The side surface of the wide portion 4*e* is tapered so as to narrow from the first principal surface 2*a* side toward the rectangular section portion 4*f* side. It is possible to reduce the distance between the electrode 3 and the electrode 4 by providing the wide portions 3*e*, 4*e*. Therefore, the capacitance between the electrodes is increased. Thus, it is possible to increase the capacitance without significantly changing the resonant characteristics.

In this way, the cross-sectional shape of each of at least one pair of electrodes 3, 4 may be a shape different from a rectangular shape, that is, a deformed shape. Each of the electrodes 3, 4 may partially have a portion extended toward the other one of the electrodes 4, 3.

Alternatively, each of the electrodes 3, 4 may have a cross-section shape like any one of, for example, the shapes shown in FIG. 20B to FIG. 20D. Each of the electrodes 3, 4 shown in FIG. 20B has a trapezoidal shape in cross section. Alternatively, each of the electrodes 3, 4 shown in FIG. 20C has a divergent shape, and both side surfaces in the width direction are curved surfaces. Alternatively, each of the electrodes 3, 4 shown in FIG. 20D has an upper end portion with a trapezoidal cross section and has a lower end portion with a trapezoidal cross section wider than the upper end portion with a trapezoidal cross section.

Figure 21A:
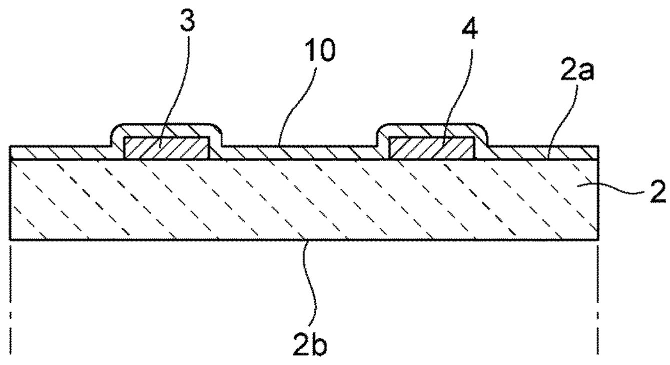
FIG. 21A to 21C are elevational cross-sectional views for illustrating further other modifications of an acoustic wave device according to a preferred embodiment of the present invention.
Figure 21B:
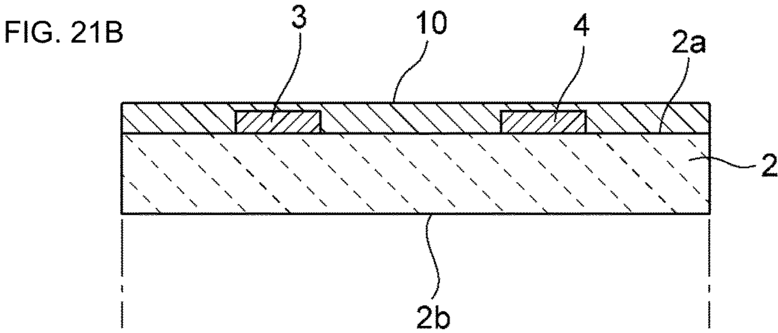
Figure 21C:
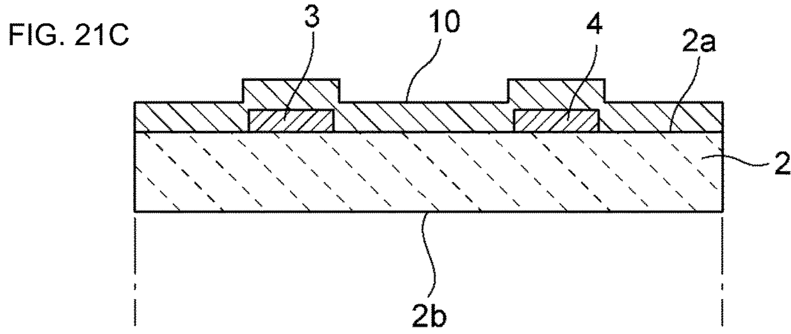

As shown in any one of FIGS. 21A to 21C, the acoustic wave device 1 may include a dielectric film 10 that covers the first principal surface 2*a* of the piezoelectric layer 2 and the electrodes 3, 4 on the first principal surface 2*a*. In FIG. 21A, the thickness of the dielectric film 10 is less than the thickness of the electrodes 3, 4, and the surface of the dielectric film 10 has an irregular shape along a base shape. In FIG. 21B, the surface of the dielectric film 10 is planarized into a planar shape. In FIG. 21C, the thickness of the dielectric film 10 is greater than the thickness of the electrodes 3, 4, and the surface of the dielectric film 10 has an irregular shape along a base shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric layer made of lithium niobate or lithium tantalate; and a first electrode and a second electrode opposed to each other in a direction that intersects with a thickness direction of the piezoelectric layer; wherein the acoustic wave device uses bulk waves in a first thickness-shear mode such that waves propagate substantially in the thickness direction of the piezoelectric layer.

2. The acoustic wave device according to claim 1, further comprising:

a first busbar to which the first electrode is connected; and a second busbar to which the second electrode is connected.

3. The acoustic wave device according to claim 1, wherein the first electrode and the second electrode have a length direction, and the first electrode and the second electrode are opposed to each other in a direction orthogonal to the length direction.

4. The acoustic wave device according to claim 1, wherein Euler angles (ϕ, θ, ψ) of the lithium niobate or the lithium tantalate fall within a range of one of expression (1), expression (2), or expression (3):

$$(-10° \leqq \phi \leqq 10°,\ 0° \leqq \theta \leqq 20°,\ \text{any } \psi) \quad \text{expression (1)}$$

$$(-10° \leqq \phi \leqq 10°,\ 20° \leqq \theta \leqq 80°,\ 0° \leqq \psi \leqq 60°(1-(\theta-50)^2/900)^{1/2}) \text{ or } (-10° \leqq \phi \leqq 10°,\ 20° \leqq \theta \leqq 80°,\ [180°-60°(1-(\theta-50)^2/900)^{1/2}] \leqq \psi \leqq 180°) \quad \text{expression (2)}$$

$$(-10° \leqq \phi \leqq 10°,\ [180°-30°(1-(\psi-90)^2/8100)^{1/2}] \leqq \theta \leqq 180°,\ \text{any } \psi). \quad \text{expression (3)}$$

5. The acoustic wave device according to claim 1, wherein Euler angles (ϕ, θ, ψ) of the lithium niobate or the lithium tantalate fall within a range of one of expression (1), expression (2), or expression (3):

$$(-10° \leqq \phi \leqq 10°,\ 0° \leqq \theta \leqq 20°,\ \text{any } \psi) \quad \text{expression (1)}$$

$$(-10° \leqq \phi \leqq 10°,\ 20° \leqq \theta \leqq 80°,\ 0° \leqq \psi \leqq 60°(1-(\theta-50)^2/900)^{1/2}) \text{ or } (-10° \leqq \phi \leqq 10°,\ 20° \leqq \theta \leqq 80°,\ [180°-60°(1-(\theta-50)^2/900)^{1/2}] \leqq \psi \leqq 180°) \quad \text{expression (2)}$$

$$(-10° \leqq \phi \leqq 10°,\ [180°-30°(1-(\psi-90)^2/8100)^{1/2}] \leqq \theta \leqq 180°,\ \text{any } \psi). \quad \text{expression (3)}$$

6. The acoustic wave device according to claim 1, wherein Euler angles (ϕ, θ, ψ) of the lithium niobate or the lithium tantalate fall within a range of one of expression (1), expression (2), or expression (3):

$$(-10° \leqq \phi \leqq 10°,\ 0° \leqq \theta \leqq 20°,\ \text{any } \psi) \quad \text{expression (1)}$$

$$(-10° \leqq \phi \leqq 10°,\ 20° \leqq \theta \leqq 80°,\ 0° \leqq \psi \leqq 60°(1-(\theta-50)^2/900)^{1/2}) \text{ or } (-10° \leqq \phi \leqq 10°,\ 20° \leqq \theta \leqq 80°,\ [180°-60°(1-(\theta-50)^2/900)^{1/2}] \leqq \psi \leqq 180°) \quad \text{expression (2)}$$

$$(-10° \leqq \phi \leqq 10°,\ [180°-30°(1-(\psi-90)^2/8100)^{1/2}] \leqq \theta \leqq 180°,\ \text{any } \psi). \quad \text{expression (3)}$$

7. The acoustic wave device according to claim 1, wherein the acoustic wave device includes a plurality of the first electrodes and a plurality of the second electrodes spaced at a pitch that is not an equal pitch in the direction in which the first electrode and the second electrode are opposed to each other.

8. The acoustic wave device according to claim 1, further comprising a support provided on a side of the piezoelectric layer, opposite to a side on which the first electrode and the second electrode are provided.

9. The acoustic wave device according to claim 8, further comprising an air gap on the side of the piezoelectric layer, opposite to the side on which the first electrode and the second electrode are provided, at a location that overlaps a portion where the first electrode and the second electrode are provided when viewing the acoustic wave device in the thickness direction of the piezoelectric layer.

10. The acoustic wave device according to claim 1, further comprising an acoustic multilayer film laminated on a side of the piezoelectric layer, opposite to a side on which the first electrode and the second electrode are provided, wherein the acoustic multilayer film has a multilayer structure including a low acoustic impedance layer having a relatively low acoustic impedance and a high acoustic impedance layer having a relatively high acoustic impedance.

11. The acoustic wave device according to claim 1, wherein the first electrode and the second electrode are opposed to each other on the same principal surface of the piezoelectric layer.

12. An acoustic wave device comprising:

- a piezoelectric layer made of lithium niobate or lithium tantalate; and
- a first electrode and a second electrode opposed to each other in a direction that intersects with a thickness direction of the piezoelectric layer; wherein
- the first electrode and the second electrode are adjacent electrodes; and
- when a thickness of the piezoelectric layer is (d) and a distance between a center of the first electrode and a center of the second electrode is (p), d/p is less than or equal to about 0.5.

13. The acoustic wave device according to claim 12, wherein the d/p is less than or equal to about 0.24.

14. The acoustic wave device according to claim 12, wherein, when viewed in the direction in which the first electrode and the second electrode are opposed to each other, a metallization ratio (MR) that is a ratio of an area of the first electrode and an area of the second electrode in an excitation region, which is a region in which the first electrode and the second electrode overlap, to the excitation region satisfies $MR \leq 1.75 (d/p)+0.075$.

15. The acoustic wave device according to claim 12, further comprising:

- a first busbar to which the first electrode is connected; and
- a second busbar to which the second electrode is connected.

16. The acoustic wave device according to claim 12, wherein the first electrode and the second electrode have a length direction, and the first electrode and the second electrode are opposed to each other in a direction orthogonal to the length direction.

17. The acoustic wave device according to claim 12, wherein Euler angles (φ, θ, ψ) of the lithium niobate or the lithium tantalate fall within a range of one of expression (1), expression (2), or expression (3):

$$(0° \pm 10°, 0° \text{ to } 20°, \text{any } \psi) \quad \text{expression (1)}$$

$$(0° \pm 10°, 20° \text{ to } 80°, 0° \text{ to } 60°(1-(\theta-50)^2/900)^{1/2}) \text{ or } (0° \pm 10°, 20° \text{ to } 80°, [180° - 60°(1-(\theta-50)^2/900)^{1/2}] \text{ to } 180°) \quad \text{expression (2)}$$

$$(0° \pm 10°, [180° - 30°(1-(\psi-90)^2/8100)^{1/2}] \text{ to } 180°, \text{any } \psi). \quad \text{expression (3)}$$

18. The acoustic wave device according to claim 12, wherein the acoustic wave device includes a plurality of the first electrodes and a plurality of the second electrodes spaced at a pitch that is not an equal pitch in the direction in which the first electrode and the second electrode are opposed to each other.

19. The acoustic wave device according to claim 12, further comprising a support provided on a side of the piezoelectric layer, opposite to a side on which the first electrode and the second electrode are provided.

20. The acoustic wave device according to claim 19, further comprising an air gap on the side of the piezoelectric layer, opposite to the side on which the first electrode and the second electrode are provided, at a location that overlaps a portion where the first electrode and the second electrode are provided in plan view.

21. The acoustic wave device according to claim 10, wherein a thickness of the piezoelectric layer is about 50 nm to about 600 nm.

22. The acoustic wave device according to claim 10, wherein a pitch of the first and second electrodes is about 1 μm to about 10 μm.

23. The acoustic wave device according to claim 10, wherein a width of at least one of the first and second electrodes is about 50 nm to about 1000 nm.

24. The acoustic wave device according to claim 10, further comprising a support substrate, wherein the support substrate includes Si and has a resistivity higher than or equal to about 4kΩ.

25. The acoustic wave device according to claim 12, further comprising:

- a first busbar to which the first electrode is connected; and
- a second busbar to which the second electrode is connected; wherein
- the first busbar and the second busbar are opposed to each other in a second direction that intersects with each of the thickness direction of the piezoelectric layer and the direction that intersects with the thickness direction.

* * * * *